United States Patent [19]
Byrd et al.

[11] Patent Number: 4,814,726
[45] Date of Patent: Mar. 21, 1989

[54] DIGITAL PHASE COMPARATOR/CHARGE PUMP WITH ZERO DEADBAND AND MINIMUM OFFSET

[75] Inventors: David A. Byrd, San Jose; Gary W. Tietz, Cupertino; Craig M. Davis, Santa Clara, all of Calif.

[73] Assignee: National Semiconductor Corporation, Santa Clara, Calif.

[21] Appl. No.: 86,011

[22] Filed: Aug. 17, 1987

[51] Int. Cl.[4] ............................................. H03L 7/18
[52] U.S. Cl. .................................... 331/1 A; 331/17; 331/27; 307/516
[58] Field of Search .................... 331/1 A, 17, 25, 27; 307/514, 516; 328/133, 134, 155

[56] References Cited

U.S. PATENT DOCUMENTS

| | | | |
|---|---|---|---|
| 3,610,954 | 10/1971 | Treadway | 331/17 X |
| 4,354,124 | 10/1982 | Shima et al. | 307/514 X |
| 4,524,333 | 6/1985 | Iwata et al. | 331/25 X |

*Primary Examiner*—Siegfried H. Grimm
*Attorney, Agent, or Firm*—Gail W. Woodward; Lee Patch; Mark Aaker

[57] ABSTRACT

A phase detector and charge pump combination is disclosed for use in a digital phase locked loop system. The phase detector includes a reset circuit that responds to the charge pump condition where it is simultaneously sourcing and sinking current. The pump up and down circuits are fast acting and balanced so that minimum conduction is employed for the phase lock condition.

3 Claims, 2 Drawing Sheets

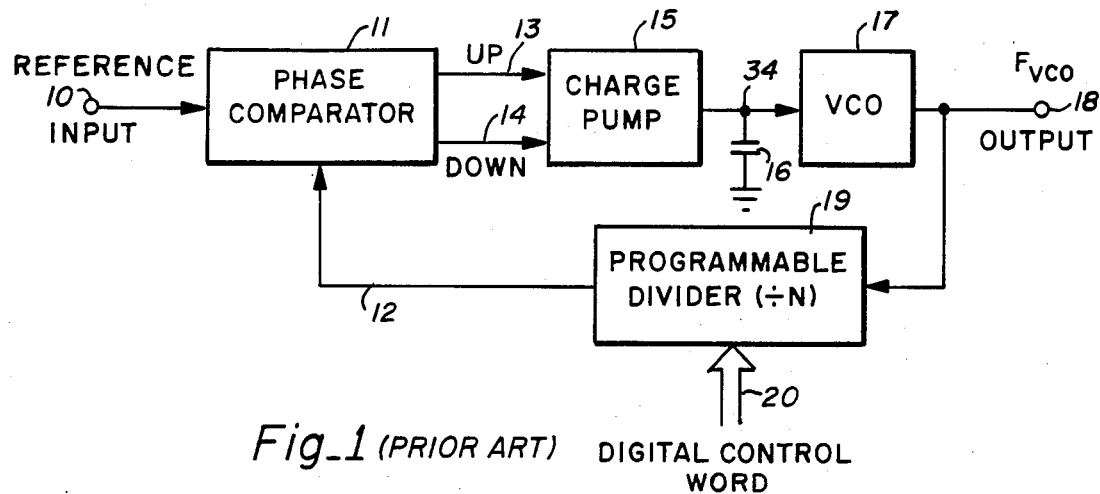
Fig_1 (PRIOR ART)
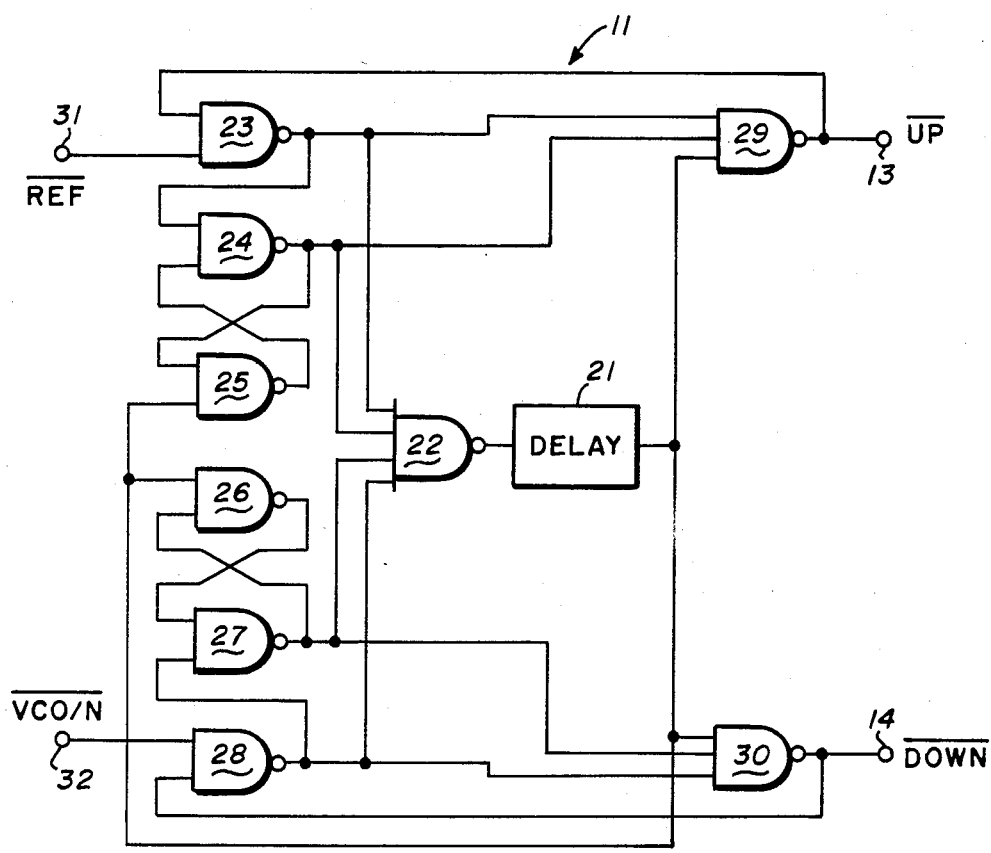
Fig_2 (PRIOR ART)

DIGITAL PHASE COMPARATOR/CHARGE PUMP WITH ZERO DEADBAND AND MINIMUM OFFSET

BACKGROUND OF THE INVENTION

The digital phase locked loop (PLL) produces an output pulse stream or clock pulses that are related in frequency to a reference clock input. This requires a digital phase comparator which produces a d-c output in proportion to the phase difference between the output and reference clock pulses. This d-c output is used to control the frequency of a voltage controlled oscillator which generates the output clock pulses. Typically, the phase comparator is combined with a charge pump that acts to set the voltage developed across a loop filter capacitor. When current is pumped into the capacitor its d-c voltage rises and when current is pumped out the voltage falls. This loop filter capacitor is connected to the VCO to set its frequency. Such an arrangement can have a dead band range in which the VCO can change phase without producing sufficient phase comparator output to activate the up/down charging mechanism. Thus, the VCO can dither within the dead band and this reduces the spectral purity of the oscillator signal.

One way to avoid such a dead band is set forth in a paper titled AN ECL/I²L FREQUENCY SYNTHESIZER FOR AM/FM RADIO WITH AN ALIVE ZONE PHASE COMPARER, by Donald R. Preslar and Joseph F. Siwinski This paper was published in the August, 1981 issue of IEEE Transactions on Consumer Electronics, pages 220–226. The teaching in this publication is incorporated herein by reference. The paper shows a conventional digital phase comparator in which a delay element is incorporated in the reset circuit. This results in both the up and down charge pumps being on for zero phase error. Such an action ensures that there is no appreciable dead band and the result is called an alive zone comparator.

The main problem is that the delay must be made longer than the turn-on time of the charge pump. This time is determined by such variables as temperature, fabrication process, and the charge pump output voltage. Accordingly, the delay is normally made longer than the worst case turn-on time and this renders the period of time, during which both the charge and discharge currents are both on, excessive. This can lead to a phase error when the charge and discharge currents are not exactly equal.

SUMMARY OF THE INVENTION

It is an object of the invention to avoid a phase comparator dead band in a digital PLL by providing a comparator reset that is a function of the charge pump having both charge and discharge functions active.

It is a further object of the invention to eliminate the dead band in a digital PLL without resorting to delay elements.

These objects are achieved as follows. A digital PLL circuit employs fast acting charge and discharge performance in the charge pump and means are provided to sense when both the charge and discharge functions are simultaneously active. The charge pump is coupled to supply source and sink current to a conventional low pass filter and VCO combination commonly employed in a PLL. The digital phase detector is of conventional construction and has a reset node that responds to the simultaneous charge pump charge and discharge actions. Thus, the two charge pump actions re present before reset can occur and no delay elements are needed. When the VCO needs to be speeded up, the up output of the phase comparator dominates and the charge pump sources current to the low pass filter. When the VCO needs to be slowed down the down output of the phase comparator dominates and the charge pump sinks current from the low pass filter. When the VCO is in phase with the reference, the charge pump both sources and sinks equal currents so that no net charge is transferred to the low pass filter and this simultaneous conduction action resets the phase comparator without delay. As a result, the dead band is eliminated regardless of temperature, fabrication process and charge pump output voltage. Another feature of the invention is the implementation of high speed charge pump switching between current sourcing and sinking.

BRIEF DESCRIPTION OF THE DRAWING

FIG. 1 is a block diagram of a conventional prior art digital phase locked loop frequency synthesis circuit.

FIG. 2 is a digital schematic diagram of a prior art phase comparator.

DESCRIPTION OF THE PRIOR ART

Figure 3:
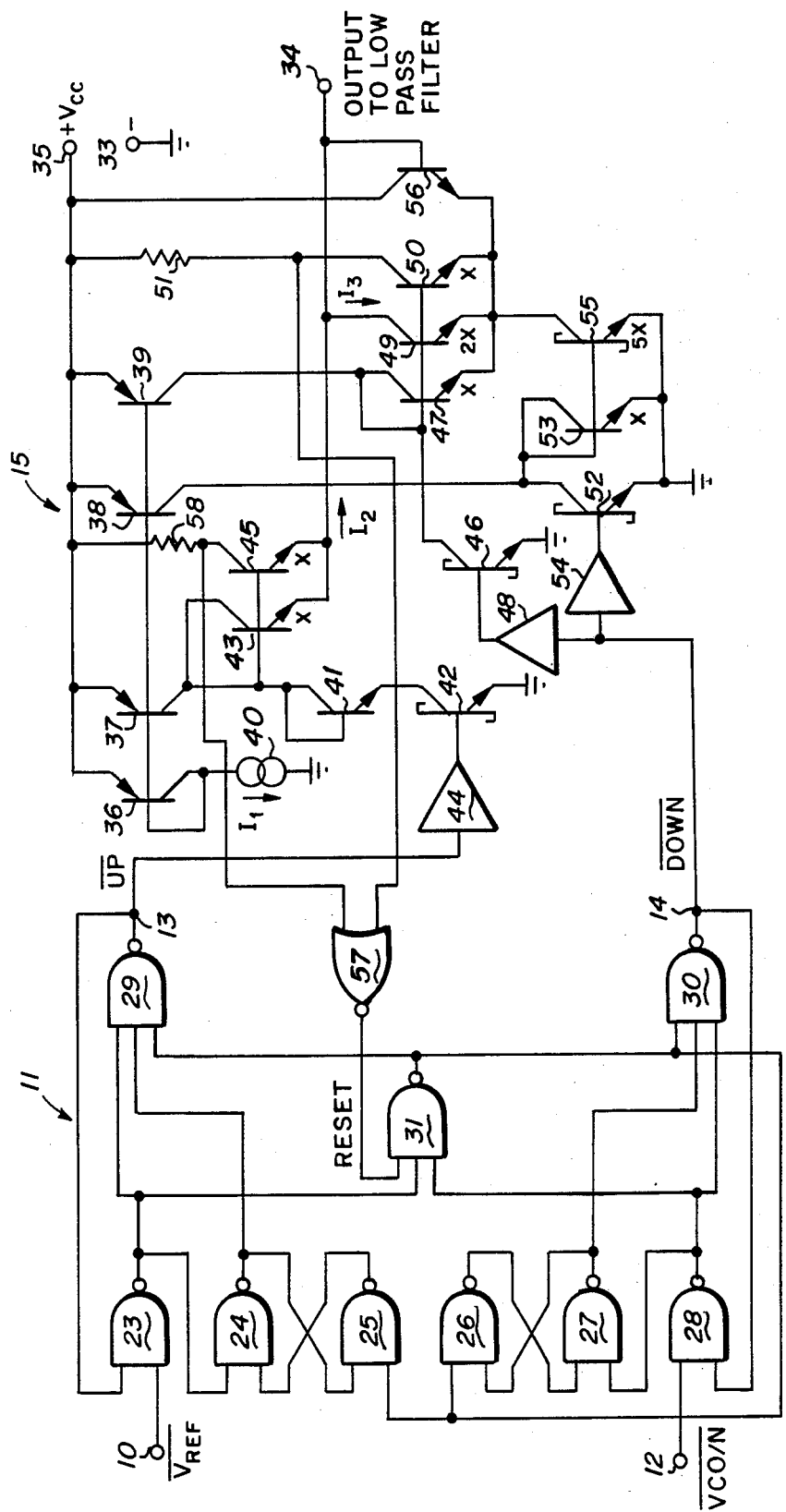
FIG. 3 is a schematic diagram of a phase comparator and charge pump circuit combination in accordance with the invention.

FIG. 1 is a block diagram of a typical prior art digital PLL. A reference input at terminal 10 provides a stable source of signal. For example a crystal controlled oscillator can be coupled to terminal 10 and, if desired, a frequency divider (not shown) can be interposed therewith. Phase comparator 11 compares the reference input with a feedback signal on line 12 to produce an output on either line 13 which directs the charge pump 15 to source current or line 14 which directs the charge pump to sink current. Capacitor 16 schematically represents a low pass filter which supplies a control voltage to VCO 17. Thus, the signal $F_{VCO}$ at terminal 18 represents the VCO output. Frequency divider 19 is programmed by the digital control word 20 to produce a division ratio of N. Thus, the signal on line 12 is $F_{VCO}/N$ The PLL will adjust the VCO until the two inputs to the phase comparator are in phase. The use of a programmable divider 19 enables digital control, via the word at 20, of the output frequency at terminal 18.

If the circuit of FIG. 1 employs a conventional phase comparator there will be a dead band within which the VCO output can dither. This results in a low purity spectrum of $F_{VCO}$. To improve this condition the circuit of FIG. 2 has been proposed. (See the IEEE reference Vol CE-27, No. 3, August 1981, pp 220–226 cited above.) Here a delay element 21 has been added to turn off NAND gate 22 which is activated from NAND gates 23-28 connected as shown to drive NAND gates 29 and 30. Terminal 31 is the reference input coupled to gate 23 and terminal 32 is the $\overline{VCO/N}$ feedback input coupled to gate 28. Gate 29 provides the "up" control of the charge pump and gate 30 provides the "down" control of the charge pump. Delay 21, which is typically four cascaded inverter gates, provides a signal delay between reset gate 22 and output control gates 29 and 30. The delay time is adequate to ensure that charge pump 15 conducts for both sourcing and sinking current from filter 16 for an interval after the phase comparator resets. As pointed out above, this delay is made to exceed the maximum value the system needs.

DESCRIPTION OF THE INVENTION

The invention, as shown in the FIG. 3 schematic diagram, resides in the phase detector and charge pump combination. Where the parts function in the same manner as the prior art the same numerals are used. A $V_{CC}$ power supply is applied + to terminal 35 and − to ground terminal 33. While not shown, the same power supply is coupled to operate the digital elements.

The charge pump 15 includes fast switching current mirrors to source and sink current to and from output terminal 34 which is connected to the PLL low pass filter (not shown). Thus, the load at terminal 34 is essentially a capacitor which will be charged or discharged as required.

Transistors 36–39 are coupled together to form a current mirror plural current source. Constant current sink 40 passes $I_1$ through diode connected transistor 36. This causes $I_1$ to be mirrored in transistors 37–39. If transistors 36–39 are matched, $I_1$ will flow in each of these transistors.

The $I_1$ flowing in transistor 37 will flow either in transistors 41 and 42, when transistor 42 is on, or in transistor 43 when transistor 42 is off. The conduction in transistor 42 is controlled by buffer 44 which is connected to $\overline{UP}$ output terminal 13 of the phase detector 11. When terminal 13 is low transistor 42 will be off and $I_1$ will flow in transistor 43. Transistor 45 will mirror $I_1$ so that $2I_1$ will be sourced to terminal 34. This current is labelled $I_2$.

The $I_1$ flowing in transistor 39 will either flow in transistor 46 when it is on, or in transistor 47 when transistor 6 is off. Transistor 46 is controlled by buffer 48 which is connected to $\overline{DOWN}$ output terminal 14 of phase detector 11. When terminal 14 is low the $I_1$ flowing in transistor 47 will be mirrored as $2I_1$ in transistor 49 which has a 2X area. Thus, $I_3$ represents a sink current from terminal 34. $I_1$ also flows in transistor 50 which has a load resistor 51 in its collector.

The $I_1$ flowing in transistor 38 flows in either 26 transistor 52 when it is conducting, or in transistor 53 when transistor 52 is off. Buffer 54 controls transistor 52 and has its input is connected to $\overline{DOWN}$ terminal 14 of phase detector 11. Therefore, when terminal 14 is low, $I_1$ will flow in transistor 53 and transistor 55 will attempt to pass $5I_1$. At this point it should be noted that transistor 56, acting as an emitter follower, will clamp the collector of transistor 55 at one $V_{BE}$ below the potential at terminal 34. This action ensures that transistor 49 will never saturate. The action of transistors 47, 49 and 50 will source $4I_1$ into transistor 55 and the additional current supplied by transistor 56 will exceed the conductivity of transistor 55 thereby avoiding saturation therein.

In the sourcing current mirror the bases of transistors 43 and 45 will be operated at the potential of terminal 34 plus one $V_{BE}$. In the sinking current mirror the bases of transistors 47, 49 and 50 will be substantially equal to the potential at terminal 34. The action of transistor 41 places the collector or transistor 42 at substantially the potential of terminal 34. Therefore, the switching action of transistors 42 and 46 will be matched. This means that since the current mirrors employ fast switching NPN transistors and the control of the mirrors is matched, these mirrors will have close to identical switching characteristics regardless of the potential at terminal 34. This action ensures that as the phase comparator operates the charge pump a minimum time offset is experienced.

It will be noted that transistor 45, in the current sourcing mirror, has a resistor 58 in its collector and the collector is coupled to one input of the two input NOR gate 57. The other NOR gate input is obtained from transistor 50 and resistor 51 as explained above.. The output of NOR gate 57 is coupled to phase detector 11 so that the reset is activated as soon as both transistors 45 and 50 go into conduction. Therefore, when $V_{REF}$ and $\overline{VCO/N}$ are in phase, each cycle of operation of the phase detector results in the simultaneous turn on of the pump up and the pump down functions and, as soon as transistors 45 and 50 turn on, the phase detector is reset. Since transistor 49 matches the combination of transistors 43 and 45, $I_2$ will equal $I_3$ and there will be no net output change at node 34. Thus, the PLL low pass filter will remain charged to the voltage level that maintains $\overline{VCO}_N$ in phase with $V_{REF}$. However, if the phase detector receives an out of phase signal condition, one of terminals 13 or 14 will become low sooner than the other and one of the current mirrors will produce a dominating current. This will produce a net output current that will change the charge on the low pass filter that will shift the VCO towards a phase lock condition.

The invention has been described and its function detailed. When a person skilled in the art reads the foregoing description, alternatives and equivalents which fall within the spirit and intent of the invention, will be apparent. Accordingly, it is intended that the scope of the invention be limited only by the following claims.

We claim:

1. A phase comparator and charge pump circuit combination suitable for use in a digital phase locked loop in which a voltage controlled oscillator provides an output signal in response to a voltage developed across a low pass loop filter, said circuit combination comprising:

a phase comparator having a reference signal input; a voltage controlled oscillator signal input, a reset input, a charge increase output and a charge decrease output;

a charge pump having an output terminal capable of sourcing or sinking current to or from said low pass filter, means for sourcing current to said output terminal, means for sinking current from said output terminal, and means for sensing when both said means for sourcing current and said means for sinking current are operating simultaneously;

means for coupling said phase comparator charge increase output to said means for sourcing current;

means for coupling said phase comparator charge decrease output to said means for sinking current; and means for coupling said charge pump means for sensing to said phase comparator reset input.

2. The circuit combination of claim 1 wherein said charge pump includes means for making said sourcing current equal to said sinking current.

3. The circuit of claim 2 wherein said means for sourcing current and said means for sinking current are configured to have equal switching speed response.

* * * * *